US010819049B2

(12) United States Patent
Matsunaga

(10) Patent No.: US 10,819,049 B2
(45) Date of Patent: Oct. 27, 2020

(54) WELDED STRUCTURE

(71) Applicant: YAZAKI CORPORATION, Tokyo (JP)

(72) Inventor: Yuta Matsunaga, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 287 days.

(21) Appl. No.: 16/000,875

(22) Filed: Jun. 5, 2018

(65) Prior Publication Data

US 2018/0366846 A1 Dec. 20, 2018

(30) Foreign Application Priority Data

Jun. 20, 2017 (JP) .................................. 2017-120910

(51) Int. Cl.
| | | |
|---|---|---|
| *H01R 11/28* | (2006.01) | |
| *H01R 43/02* | (2006.01) | |
| *H05K 3/32* | (2006.01) | |
| *H01R 11/05* | (2006.01) | |
| *H01R 4/62* | (2006.01) | |
| *H01M 2/20* | (2006.01) | |
| *H01M 10/48* | (2006.01) | |

(52) U.S. Cl.
CPC .......... *H01R 11/288* (2013.01); *H01M 2/202* (2013.01); *H01M 10/48* (2013.01); *H01R 4/62* (2013.01); *H01R 4/625* (2013.01); *H01R 11/05* (2013.01); *H01R 43/02* (2013.01); *H01R 43/0221* (2013.01); *H05K 3/328* (2013.01)

(58) Field of Classification Search
CPC ........ H01R 11/288; H01R 4/62; H01R 4/625; H01R 11/05; H01R 43/02; H01R 43/0221; H01M 2/202; H01M 10/48; H05K 3/328
USPC ......................................................... 439/627
See application file for complete search history.

(56) References Cited

U.S. PATENT DOCUMENTS

| | | | |
|---|---|---|---|
| 4,870,227 A | | 9/1989 | Saen et al. |
| 10,305,083 B2* | | 5/2019 | Nakayama ............... H01M 2/30 |
| 2014/0349148 A1* | | 11/2014 | Ikeda .................. H01M 2/0491 |
| | | | 429/56 |
| 2018/0205062 A1 | | 7/2018 | Nakayama et al. |

FOREIGN PATENT DOCUMENTS

| | | | |
|---|---|---|---|
| JP | 54-168531 U | | 11/1979 |
| JP | 62-26761 A | | 2/1987 |
| JP | 6-292979 A | | 10/1994 |
| JP | 8-15103 B2 | | 2/1996 |
| JP | 2013131358 A | * | 7/2013 |
| JP | 2015-187910 A | | 10/2015 |
| JP | 2017-27926 A | | 2/2017 |

* cited by examiner

*Primary Examiner* — Edwin A. Leon
(74) *Attorney, Agent, or Firm* — Kenealy Vaidya LLP

(57) ABSTRACT

Provided is a welded structure in which a voltage detection terminal (21) plated with tin and a busbar (25) plated with nickel are welded, the busbar (25) having a thickness greater than that of the voltage detection terminal (21) and being formed with a protrusion (25*c*) which protrudes toward the voltage detection terminal (21) on a part of a surface facing the voltage detection terminal (21) at the time of being welded with the voltage detection terminal (21).

5 Claims, 6 Drawing Sheets

WELDED STRUCTURE

CROSS REFERENCE TO RELATED APPLICATIONS

This application is based on Japanese Patent Application (No. 2017-120910) filed on Jun. 20, 2017, the contents of which are incorporated herein by way of reference.

BACKGROUND

The present invention relates to a welded structure in which two conductors are welded and joined.

A battery pack in which an electrode terminal of a battery cell and a busbar are reliably and stably electrically connected has been described in JP-A-2015-187910. Especially, JP-A-2015-187910 discloses that a plating layer of a busbar is a nickel-plated layer. In addition, a battery pack of JP-A-2015-187910 includes a voltage detection circuit for detecting the voltage of a battery cell and a voltage detection terminal is connected to the plating layer of the busbar. Further, a lead wire is connected to the voltage detection terminal and the voltage detection terminal of the battery cell can be connected to the voltage detection circuit via the lead wire.

SUMMARY

A welded structure according to the present invention is characterized by the following (1) to (3).
(1) A welded structure, including:
a first conductor which is plated with one of tin and a metal material having a melting point higher than that of the tin; and
a second conductor which is plated with the other of the tin and the metal material, has a thickness greater than that of the first conductor, and is formed with a protrusion which protrudes toward the first conductor on a part of a surface facing the first conductor at a time of being welded with the first conductor, wherein
a part of the first conductor located at a position opposite to the protrusion and a top of the protrusion of the second conductor are joined so that the first conductor and the second conductor are welded to each other.
(2) The welded structure according to (1), wherein
the metal material is nickel.
(3) The welded structure according to (2), wherein
the second conductor is a busbar which is connected to an electrode formed in a battery pack, and
the first conductor is a voltage detection terminal which is connected to the busbar for detecting a voltage of the electrode.

DETAILED DESCRIPTION OF EXEMPLIFIED EMBODIMENTS

When the voltage detection terminal described in JP-A-2015-187910 is connected to the plating layer of the busbar, joining may be performed by laser welding or electric welding. However, when the voltage detection terminal plated by tin is welded to the busbar described above which is plated by nickel, thermal energy due to welding may be deprived by a nickel plated layer having a melting point higher than that of tin, and thus heat may not be sufficiently transferred to the contact portion of the tin plated layer of the voltage detection terminal and the nickel plated layer of the busbar. Therefore, the tin plated layer in the vicinity of the contact portion of the voltage detection terminal does not melt sufficiently and remains. As a result, favorable connection between the voltage detection terminal and the busbar is hindered. More specifically, when heat is not sufficiently transferred to the contact portion, an intermetallic compound is formed by the tin plated layer and the nickel plated layer in the vicinity of the contact portion and the inventor of the invention has found that the intermetallic compound is a factor of hindering favorable connection between the voltage detection terminal and the busbar.

The invention has been made in view of the circumstances described above and an object thereof is to provide a welded structure capable of realizing favorable connection between a conductor plated with tin and another conductor plated with a metal material having a melting point higher than that of tin.

A specific embodiment relating to the invention will be described below with reference to the drawings.

An embodiment in which a welded structure according to the invention is applied to a conductor module will be described in detail. The embodiment to be described hereinafter is an embodiment in which the welded structure according to the invention is applied to a conductor module, but it is only one mode of the welded structure according to the invention. It is noted that the welded structure according to the invention can be applied to various welded structures in which two conductors are welded.

Structure of Conductor Module 100

Figure 1:
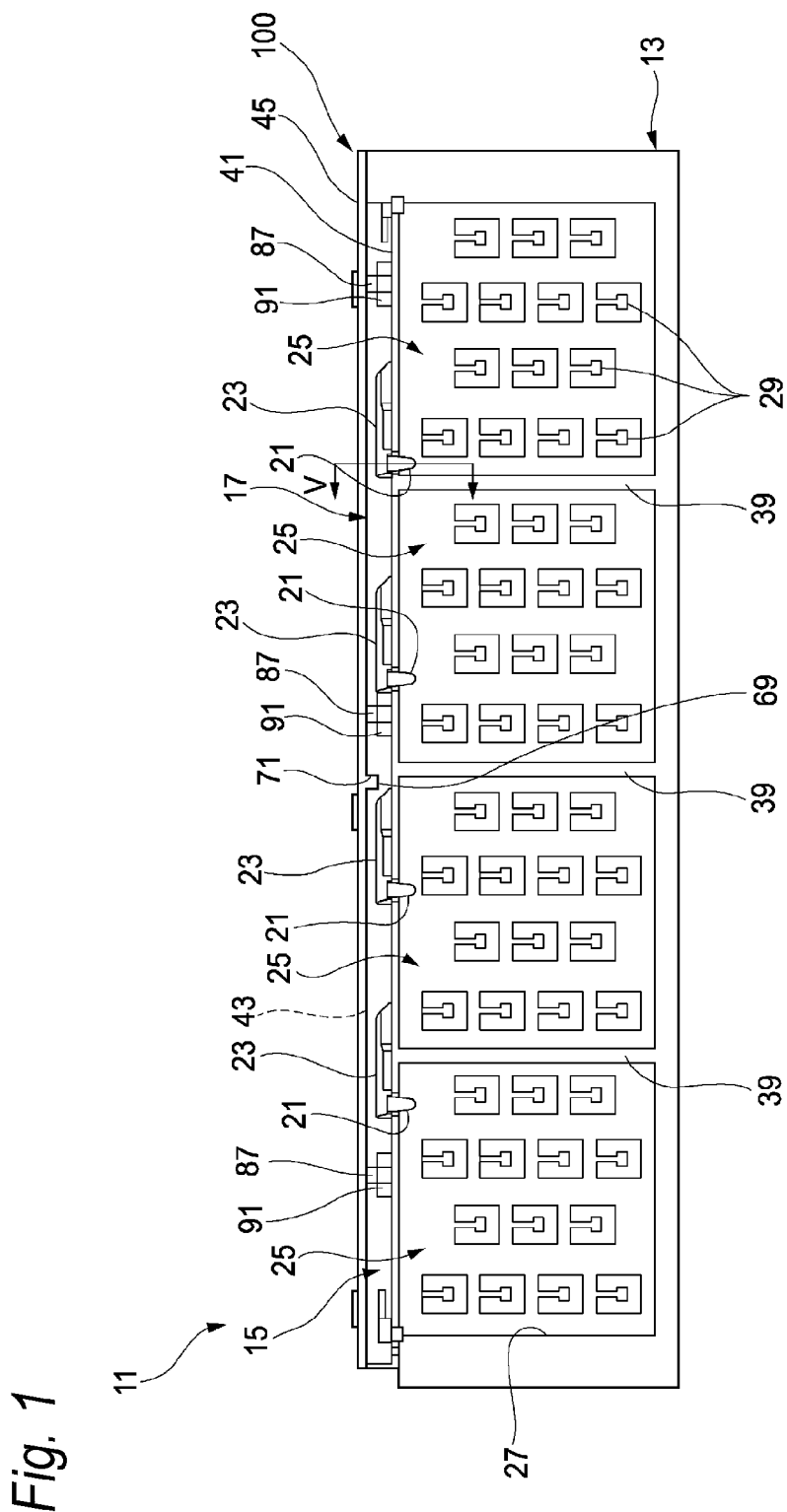
FIG. 1 is a plan view of a battery pack having a conductor module mounting structure according to an embodiment of the invention.
Figure 2:
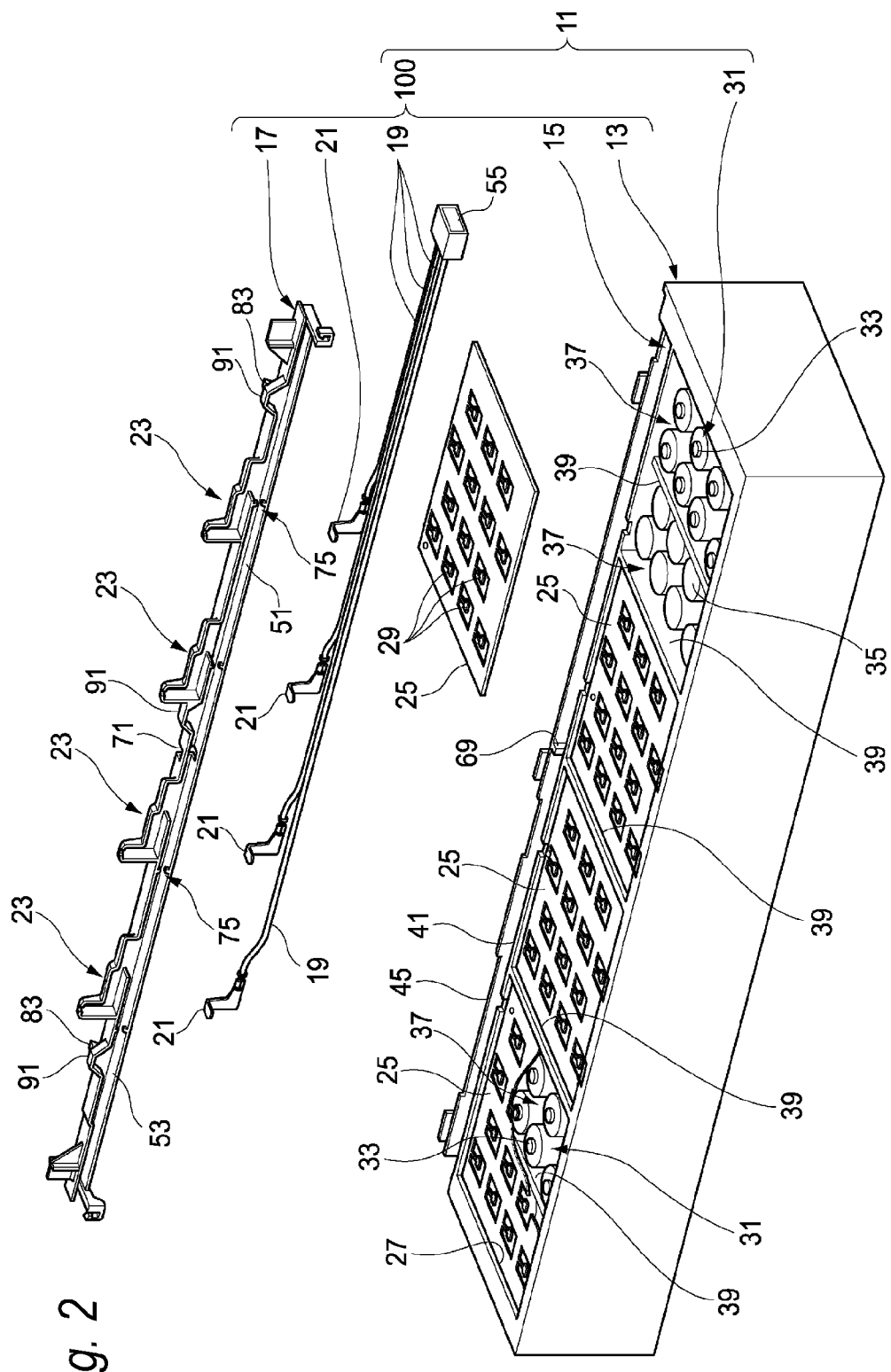
FIG. 2 is an exploded perspective view of the battery pack having the conductor module mounting structure according to the embodiment of the invention.
Figure 3:
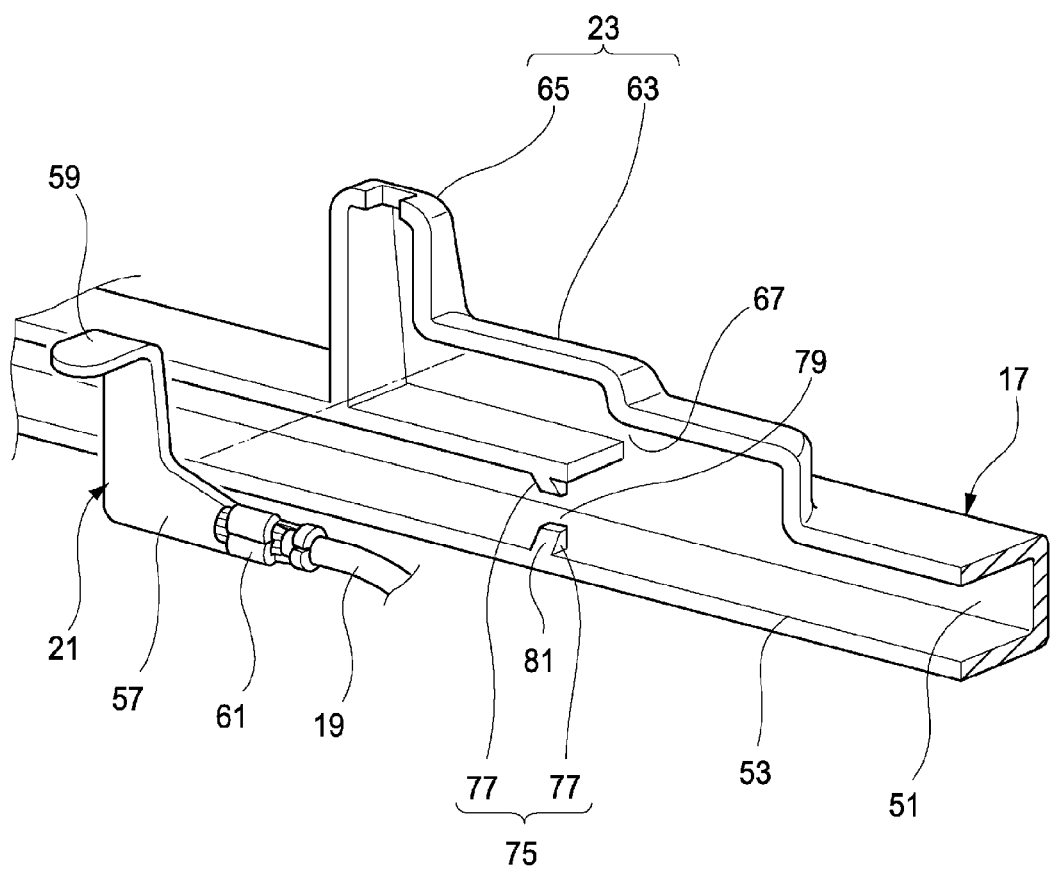
FIG. 3 is an enlarged view of a main part of a terminal holder illustrated in FIG. 2.
Figure 4:
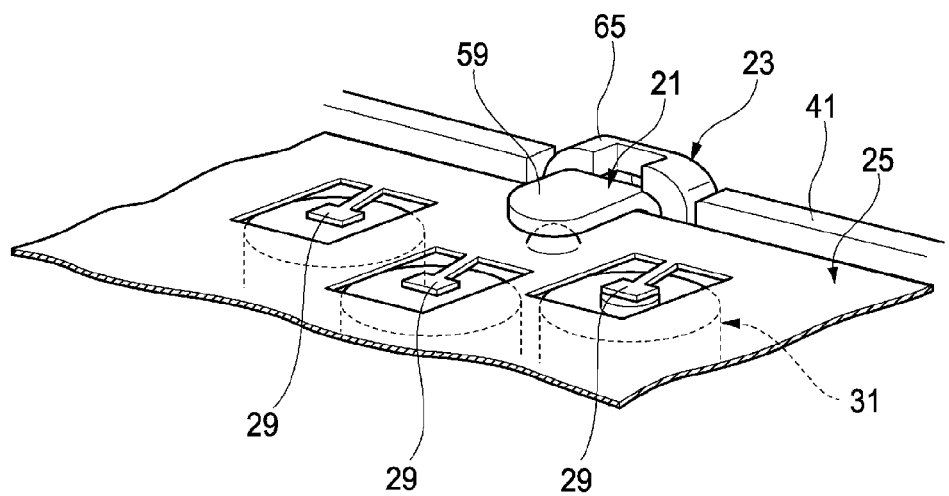
FIG. 4 is a perspective view of a voltage detection terminal which is positioned to be brought into contact with a busbar.

Hereinafter, the embodiment of the invention will be described with reference to the drawings. FIG. 1 is a plan view of a battery pack 11 having a conductor module mounting structure according to the embodiment of the invention. FIG. 2 is an exploded perspective view of the battery pack 11 having the conductor module mounting structure according to the embodiment of the invention. FIG. 3 is an enlarged view of a main part of a terminal holder illustrated in FIG. 2. FIG. 4 is a perspective view of a voltage detection terminal which is positioned to be brought into contact with a busbar.

The conductor module mounting structure according to the embodiment is suitable for use in the battery pack 11 having a plurality of unit cells 31.

As illustrated in FIGS. 1 and 2, the battery pack 11 includes a conductor module 100. The conductor module 100 is mainly constituted of a case 13 in which a plurality of unit cells 31 are accommodated, a recessed groove 15 which is provided in the case 13, a protector 17 which is inserted into the recessed groove 15, a voltage detection line 19 which is routed in the protector 17, and a voltage detection terminal 21 which is connected to one end of the voltage detection line 19.

The case 13 includes a busbar 25 for electrically connecting the plurality of unit cells 31. The case 13 is formed in a rectangular parallelepiped box shape of which an upper surface and a lower surface are open as a conductor arrangement space 27 in which the busbar 25 is arranged. The case 13 can be made of, for example, insulating resin. In the conductor arrangement space 27 on the upper surface, a plurality of the busbars 25 formed in a substantially square plate shape are mounted side by side in a longitudinal direction of the case 13. In the present embodiment, four busbars 25 are mounted, but the number is not limited to four. On the other hand, a plurality of busbars 25 and a substantially rectangular busbar are mounted side by side in the longitudinal direction of the case 13 in the conductor arrangement space 27 on the lower surface (not illustrated).

In each busbar 25, a plurality of terminal portions 29 are formed in four rows. Each terminal portion 29 is integrally formed with the busbar 25 as an elastic flexible piece by punching the plate-shaped busbar 25 around each terminal portion 29. The terminal portions 29 of each row correspond to the arrangement of the plurality of unit cells 31 accommodated in the case 13. In the embodiment, four terminal portions are provided in the first row from the left side in FIG. 1, three terminal portions are provided in the second row, four terminal portions are provided in the third row, and three terminal portions are provided in the fourth row.

Each busbar 25 is held in the conductor arrangement space 27 of the case 13. Holding the busbar 25 can be carried out by, for example, an engaging claw or the like (not illustrated) formed in the case 13. The busbar 25 is held to be able to cover a plurality of cylindrical unit cells 31 accommodated in the case 13. In the unit cell 31, one end in a direction along the axis is a positive electrode 33 and the other end is a negative electrode 35.

In the case 13, eight unit cell accommodating chambers 37 each of which accommodates seven unit cells 31 arranged in two rows are partitioned by partition walls 39.

The unit cells 31 are accommodated in the first unit cell accommodating chamber 37 from the left side in FIG. 2 with the negative electrodes 35 facing up and accommodated in the second unit cell accommodating chamber 37 with the positive electrodes 33 facing up. Further, the unit cells 31 are accommodated in the unit cell accommodating chambers 37 so that the negative electrodes 35 and the positive electrodes 33 alternately face up. Therefore, by installing the busbars 25 across the adjacent unit cell accommodating chambers 37 of the conductor arrangement spaces 27, seven unit cells 31 with the negative electrodes 35 facing up and the seven unit cells 31 with the positive electrodes 33 facing up are connected in series. The rectangular busbars installed in the unit cell accommodating chambers 37 positioned at both ends in the longitudinal direction of the conductor arrangement spaces 27 on the lower surface are respectively set to be the total positive electrode and the total negative electrode.

The recessed groove 15 protrudes from an outer wall 41 of the case 13 and extends along the upper edge of the outer wall 41. The recessed groove 15 is constituted of an outer wall 41, a bottom wall 43, and a side wall 45. The bottom wall 43 vertically protrudes from the outer wall 41 of the case 13 and is formed to extend in the longitudinal direction of the case 13. The side wall 45 rises vertically from the protruding tip end of the bottom wall 43. Therefore, in the recessed groove 15, a space between the outer wall 41 and the side wall 45 with the bottom wall 43 interposed therebetween becomes the groove space. Therefore, the groove space is surrounded by an inner wall surface 47 which is constituted of the outer wall 41, a bottom wall surface 49, and the side wall 45.

The protector 17 is elongated along the recessed groove 15 of the case 13 and has a sectional shape perpendicular to the longitudinal direction formed in a U shape. The protector 17 can be made of, for example, insulating resin. In the embodiment, the protector 17 is formed to have a laterally U-shaped cross section in which an opening portion 53 of a U-shaped groove 51 is opened at the side surface. The protector 17 is inserted into the recessed groove 15 in a direction where the protector 17 has the lateral U-shaped cross section. The opening portion 53 of the U-shaped groove 51 is closed by the inner wall surface 47 which is a surface on the side opposite to the busbar 25 in the outer wall 41 of the recessed groove 15.

The protector 17 may be formed to be inserted in a direction where the protector 17 has an inverted U-shaped cross-section in which the opening portion 53 of the U-shaped groove 51 becomes a lower surface. The protector 17 may be formed to be inserted in a direction where the opening portion 53 of the U-shaped groove 51 is closed by the inner wall surface 47 which is the inner surface of the side wall 45 of the recessed groove 15. That is, in the protector 17, the opening portion 53 of the U-shaped groove 51 may be closed by the inner wall surface 47 when the protector 17 is inserted into the recessed groove 15 of the case 13.

A voltage detection line 19 is routed in the U-shaped groove 51 of the protector 17. The voltage detection line 19 is accommodated in the protector 17 to correspond to each busbar 25. Therefore, in the embodiment, four voltage detection lines 19 are routed in the U-shaped groove 51 of the protector 17. The voltage detection terminal 21 is connected to one end of each of the four voltage detection lines 19. The other ends of the respective voltage detection lines 19 in which the voltage detection terminals 21 are connected to the one ends are collectively connected to a voltage detection connector 55. The voltage detection terminal 21 is connected to a battery monitoring unit (not illustrated) via the voltage detection line 19 and the voltage detection connector 55 and transmits voltage information of the respective busbars 25.

FIG. 3 is an enlarged view of a main part of a terminal holder 23 illustrated in FIG. 2.

The voltage detection terminal 21 is constituted of a terminal body portion 57 which has an L shape when viewed from the side, an electric contact portion 59 which is bent from the upper end of the terminal body portion 57 to the busbar 25 to be parallel to the busbar 25, and a conductor connection portion 61 which is formed at the base end of the terminal body portion 57. The conductor connection portion 61 is connected with a conductor of the voltage detection line 19 by crimping or the like.

In the protector 17, the terminal holders 23 are formed at positions (four places in the embodiment) corresponding to respective busbars 25. The terminal holder 23 is formed to protrude in an L shape on the upper surface of the protector 17. The terminal holder 23 is constituted of an electric wire lead-out portion 63 at the lower portion and a terminal support portion 65 at the upper portion.

The electric wire lead-out portion 63 is formed in an elongated stepwise shape and communicates with the U-shaped groove 51. The electric wire lead-out portion 63 leads one end of the voltage detection line 19 from the U-shaped groove 51 of the protector 17 inserted into the recessed groove 15 to the terminal support portion 65 via a communication port 67. The terminal support portion 65 rises vertically from the electric wire lead-out portion 63. In the terminal support portion 65, a voltage detection terminal 21 which is connected to the one end of the voltage detection line 19 led out from the electric wire lead-out portion 63 is accommodated. The electric wire lead-out portion 63 and the terminal support portion 65 are open at surfaces facing the outer wall 41 of the case 13.

FIG. 4 is a perspective view of the voltage detection terminal 21 which is positioned to be brought into contact with a busbar 25.

As illustrated in FIG. 4, the upper end of the terminal support portion 65 is located higher than the outer wall 41 of the case 13 in a state where the protector 17 is completely inserted into the recessed groove 15. In the terminal support portion 65, the electric contact portion 59 of the voltage detection terminal 21 is arranged in parallel on the busbar from the side portion opened at a position higher than that of the outer wall 41. In other words, the terminal support portion 65 allows the electric contact portion 59 of the voltage detection terminal 21 to be led out to the outside of the protector 17 and to be positioned at which the electric contact portion 59 can come into contact with the upper surface of the busbar 25 in a state where the protector 17 is inserted in the recessed groove 15. The electric contact portion 59 positioned to come into contact with the busbar 25 is electrically joined to the busbar 25 by welding.

In the recessed groove 15 of the case 13, a positioning rib 69 is provided (projected) to protrude toward the inside of the groove. The positioning rib 69 is formed as a protrusion which extends in an up-down direction (a depth direction of the recessed groove 15) on the inner surface of the side wall 45 of the recessed groove 15. That is, the positioning rib 69 extends in the insertion direction of the protector 17. In the embodiment, one positioning rib 69 is provided at the central portion in the extending direction of the recessed groove 15, but the position and the number thereof are not limited.

In the protector 17, a positioning concave portion 71 for receiving this positioning rib 69 is provided. The positioning concave portion 71 is formed by cutting the bottom plate of the U-shaped groove 51 of the protector 17 in the up-down direction (the depth direction of the recessed groove 15). The protector 17 is positioned at a prescribed position with respect to the case 13 by engaging the positioning concave portion 71 with the positioning rib 69.

Further, in the protector 17, a jumping-out restricting claw 75 is formed in the U-shaped groove 51, as illustrated in FIG. 3. The jumping-out restricting claw 75 is constituted of a pair of claw protrusions 77 which respectively protrudes from the U-groove inner wall surfaces of the U-shaped groove 51 toward the U-groove inner wall surfaces on the opposing side. A gap is formed between the projecting tips of the pair of claw protrusions 77. The gap serves as an insertion opening 79 when the voltage detection line 19 is inserted into the U-shaped groove 51. In each claw protrusion 77, the surface on the outer side of the U-shaped groove 51 is an introduction inclined surface 81 extending toward the gap and the surface on the inner side of the U-shaped groove 51 is a flat surface parallel to the bottom plate 73 of the U-shaped groove 51. The voltage detection line 19 which passes through the jumping-out restricting claw 75 and is routed in the U-shaped groove 51 is restricted from jumping out of the U groove by the flat surface of the claw protrusion 77.

A locking mechanism 83 for restricting the detachment of the protector 17 from the recessed groove 15 is provided between the case 13 and the protector 17. The locking mechanism 83 is constituted of, for example, a locking hole and a locking claw. The locking hole is provided in either the case 13 or the protector 17. The locking claw is provided on the other of the case 13 and the protector 17. In the locking mechanism 83 of the embodiment, the locking hole is drilled in the case 13 and the locking claw protrudes in the protector 17. It is needless to say that the locking mechanism according to the present invention is not limited to the locking mechanism 83 of the embodiment but may have various forms.

In the protector 17, a pressing portion 91 is provided to be adjacent to the locking claw of the locking mechanism 83. The pressing portion 91 is formed in a trapezoidal shape of which the top serves as a pressing flat surface 93. The pressing flat surface 93 of the pressing portion 91 is arranged higher than the upper end of the locking claw of the locking mechanism 83. The pressing portion 91 is arranged slightly lower than the opening of the recessed groove 15 in a state where the protector 17 is completely inserted into the recessed groove 15. The pressing portion 91 makes it easier for the locking claw to be locked to the locking hole when the pressing flat surface 93 is pressed with the operator's fingers. In other words, the pressing portion 91 functions to enhance the visibility of the locked portion and to enable an easy locking operation of locking the locking claw to the locking hole.

Next, the assembling procedure of the conductor module mounting structure having the structure described above will be described.

The voltage detection line 19 with the voltage detection terminal is installed in the protector 17 to assemble conductor module 100 in advance. In a case of the voltage detection line 19 with the voltage detection terminal, the voltage detection terminal 21 is inserted into the terminal support portion 65 in the terminal holder 23 of the protector 17, and then the connected voltage detection line 19 is inserted into the U-shaped groove 51. In this case, the voltage detection line 19 is easily restricted from being fallen off from the U-shaped groove 51 by inserting the voltage detection line 19 into the U-shaped groove 51 through the gap of the jumping-out restricting claw 75. Similarly, all voltage detection lines 19 with the voltage detection terminals are installed in the protector 17.

The pre-assembly of the protector 17 is completed by installing all voltage detection line 19 with the voltage detection terminals. As described above, in the conductor module 100 having the conductor module mounting structure of the embodiment, the voltage detection terminal 21 and the voltage detection line 19 can be pre-assembled in advance with the protector 17.

The pre-assembled protector 17 is inserted into the recessed groove 15 of the case 13 in which the plurality of unit cells 31 and the plurality of busbars 25 are accommodated. The protector 17 is inserted with the U groove side as the front end side in the insertion direction and the terminal holder side as the rear end side in the insertion direction. Further, when installation is performed, the positioning concave portion 71 of the protector 17 is inserted so as to coincide with the positioning rib 69 of the recessed groove 15.

When the protector 17 is inserted into the recessed groove 15 to a certain depth, the locking claw of the locking mechanism 83 of the protector 17 abuts against the upper end of the side wall 45 in the recessed groove 15. In this state, the protector 17 is further pressed into the recessed groove 15 by pushing the pressing flat surface 93 of the protector 17. The locking claw elastically deforms in a direction away from the side wall 45 and bends toward the inside of the recessed groove 15. When the protector 17 is inserted to the prescribed position, the positions of the locking claw and the locking hole of the locking mechanism 83 are matched. The locking claw which is resiliently restored in conformity with the locking hole is engaged with the locking hole. The installation of the protector 17 to the case 13 is completed by locking the locking mechanism 83. The electric contact portion 59 of the voltage detection terminal 21 is electrically joined to the busbar 25 by welding.

Structure of Voltage Detection Terminal 21 and Busbar 25

Figure 5A:
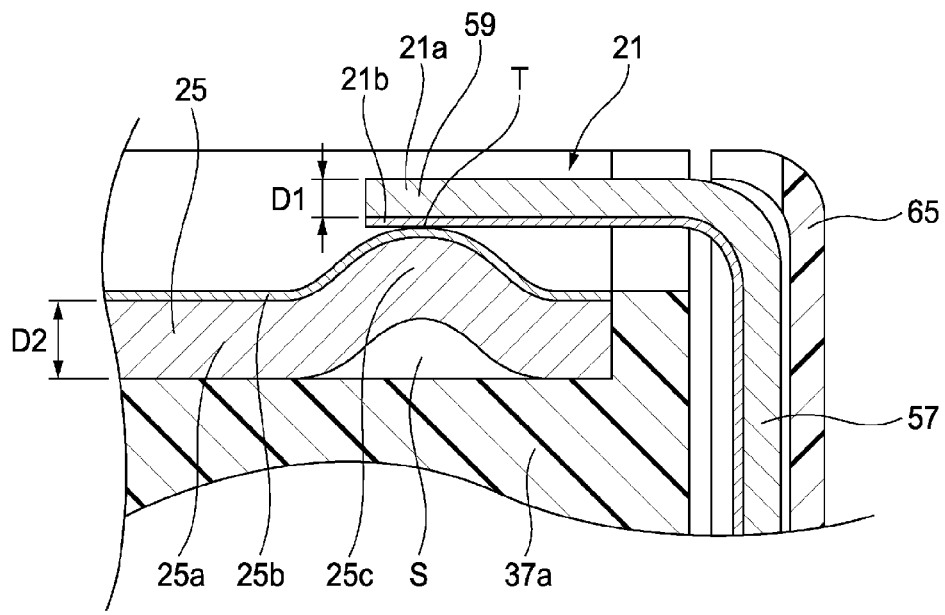
FIG. 5A is a cross-sectional view taken along line V-V in FIG. 1 which illustrates the conductor module mounting structure according to the embodiment of the invention before the voltage detection terminal and a busbar are welded and FIG. 5B is a cross-sectional view taken along the line V-V in FIG. 1 which illustrates the conductor module mounting structure according to the embodiment of the invention after the voltage detection terminal and the busbar are welded.
Figure 5B:
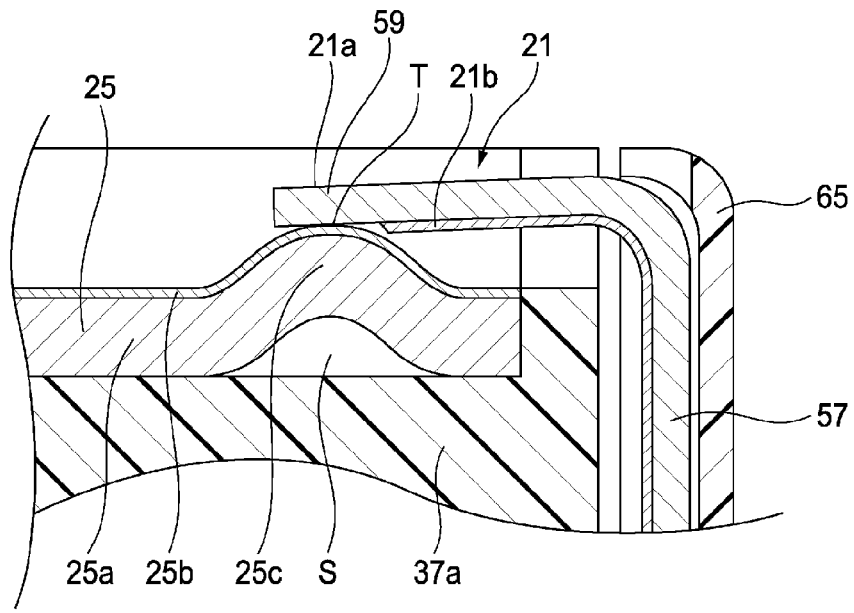

Subsequently, the structure before and after welding of the voltage detection terminal 21 and the busbar 25 will be described in detail. In FIGS. 5A and 5B, FIG. 5A is a cross-sectional view taken along the line V-V in FIG. 1 which illustrates the conductor module mounting structure according to the embodiment of the invention before the voltage detection terminal 21 and the busbar 25 are welded and FIG. 5B is a cross-sectional view taken along the line V-V in FIG. 1 which illustrates the conductor module mounting structure according to the embodiment of the invention after the voltage detection terminal 21 and the busbar 25 are welded.

As illustrated in FIG. 5A, the voltage detection terminal 21 is constituted of a terminal base material 21a which is formed of a copper material and a tin plated layer 21b which is plated with tin on a surface (in other words, a surface located inside the bent terminal base material 21a) facing the busbar 25. The busbar 25 is constituted of a busbar base material 25a which is formed of a copper material and a nickel plated layer 25b which is plated with nickel on a surface facing the voltage detection terminal 21, as illustrated in FIG. 5A.

A thickness D2 of the busbar base material 25a of the busbar 25 is set to be greater than a thickness D1 of the terminal base material 21a of the voltage detection terminal 21. In the busbar 25, a protrusion 25c protruding toward the voltage detection terminal 21 is formed on a part of the surface facing the voltage detection terminal 21. In the present embodiment, the protrusion 25c is formed by providing an indent on a part of a surface opposite to the voltage detection terminal 21. In the protrusion 25c, a top T (the top refers to the top and the vicinity of the top of the nickel plated layer 25b which protrudes toward the voltage detection terminal 21. It should be noted that the vicinity of the top means a certain range including the top of the nickel plated layer 25 joined with the terminal base material 21a after welding.) is brought into contact with the voltage detection terminal 21.

The busbar 25 is disposed in the unit cell accommodating chamber 37 by being placed on the partition wall 39 of the unit cell accommodating chamber 37 and a rib 37a formed on the inner wall surface defining the unit cell accommodating chamber 37. Therefore, a gap S is formed between the protrusion 25c of the busbar 25 and the partition wall 39 or the rib 37a of the unit cell accommodating chamber 37.

When the voltage detection terminal 21 and the busbar 25 are welded, those become as shown in FIG. 5B. In other words, in the electric contact portion 59, a part of the tin plated layer 21b which is in contact with the top T of the protrusion 25c melts and scatters to the periphery as spatters (as metal scrap), so that a part of the tin plated layer 21b removed from the terminal base material 21a. In this state, the terminal base material 21a of the voltage detection terminal 21 is joined to the nickel plated layer 25b of the busbar 25. Further, since the electric contact portion 59 is welded in a state of being pressed toward the busbar 25 and a part of the tin plated layer 21b is removed from the terminal base material 21a, the electric contact portion 59 is joined in a shape in which the tip of the electric contact portion 59 is inclined to be lowered.

As described above, according to the conductor module mounting structure of the embodiment of the invention, a part of the tin plated layer 21b which is in contact with the top T of the protrusion 25c can be welded effectively. As a result, the part of the tin plated layer 21b is scattered around as spatters and removed from the terminal base material 21a, and thus the connection between the voltage detection terminal and the busbar is not hindered by the tin plating remaining without being sufficiently melted. Therefore, a favorable connection between the voltage detection terminal and the busbar can be secured.

Figure 6A:
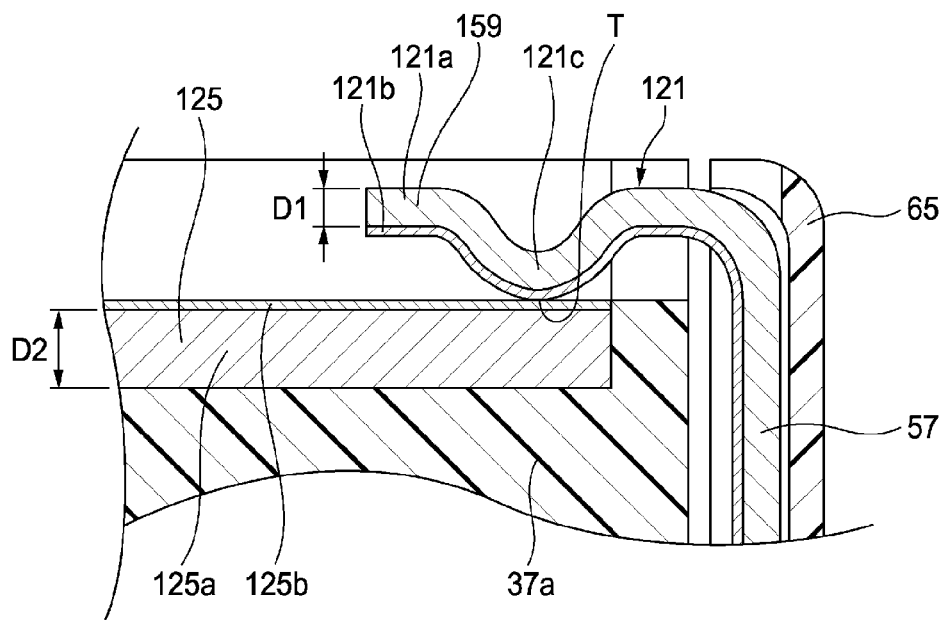
FIG. 6A is a cross-sectional view of a portion corresponding to that illustrated in FIGS. 5A and 5B which illustrates a conductor module mounting structure according to a comparative example of the invention before the voltage detection terminal and the busbar are welded and FIG. 6B is a cross-sectional view of the portion corresponding to that illustrated in FIGS. 5A and 5B which illustrates the conductor module mounting structure according to the comparative example of the invention after the voltage detection terminal and the busbar are welded.

Hereinafter, referring to a conductor module mounting structure according to a comparative example of the present invention, the operation and the effect of the conductor module mounting structure according to the embodiment of the invention will be described in more detail. In the FIGS. 6A and 6B, FIG. 6A is a cross-sectional view of a portion corresponding to that illustrated in FIGS. 5A and 5B which illustrates the conductor module mounting structure according to the comparative example of the invention before the voltage detection terminal 21 and the busbar 25 are welded and FIG. 6B is a cross-sectional view of the portion corresponding to that illustrated in FIGS. 5A and 5B which illustrates the conductor module mounting structure according to the comparative example of the invention after the voltage detection terminal 21 and the busbar 25 are welded.

Points different from the conductor module mounting structure according to the embodiment of the invention described with reference to FIGS. 5A and 5B will be described. As illustrated in FIG. 6A, the voltage detection terminal 121 is constituted of a terminal base material 121a which is formed of a copper material and a tin plated layer 121b which is plated with tin on a surface (in other words, a surface located inside the bent terminal base material 121a) facing the busbar 125. The busbar 125 is constituted of a busbar base material 125a which is formed of a copper material and a nickel plated layer 125b which is plated with nickel on a surface facing the voltage detection terminal 121, as illustrated in FIG. 6A.

A thickness D2 of the busbar base material 125a of the busbar 125 is set to be greater than a thickness D1 of the terminal base material 121a of the voltage detection terminal 121. In the voltage detection terminal 121, a protrusion 121c protruding toward the busbar 125 is formed on a part of the surface facing the busbar 125. In the present embodiment, the protrusion 121c is formed by providing an indent on a part of a surface opposite to the busbar 125. The top T of the protrusion 121c is in contact with the busbar 125.

Figure 6B:
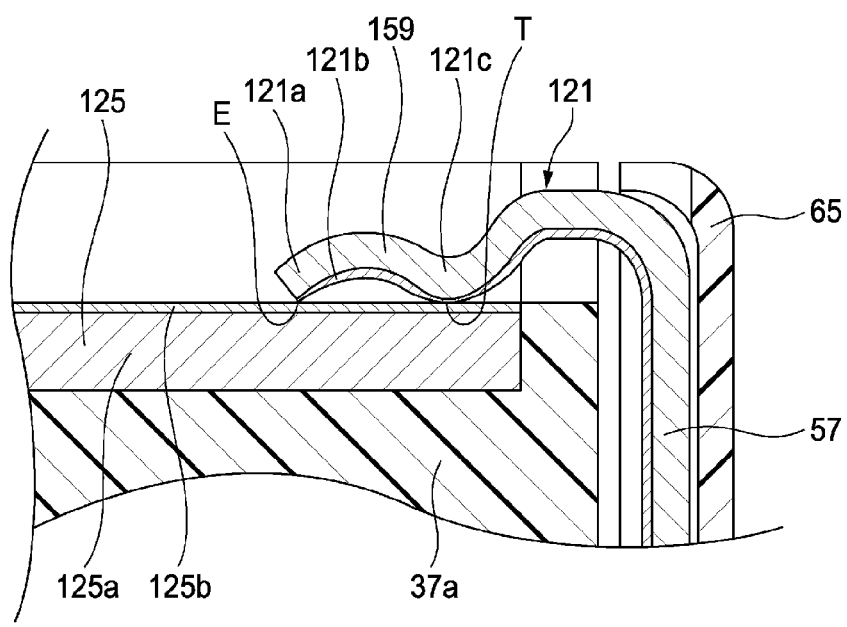

When the voltage detection terminal 121 and the busbar 125 are welded, those become as illustrated in FIG. 6B. In other words, the electric contact portion 159 is pressed towards the busbar 125 so that the top T of the protrusion 121c is brought into contact with the nickel plated layer 125b of the busbar 125. Further, the electric contact portion 159 is thinner and easier to deform than the busbar 125, and thus a tip E of the electric contact portion 159 faces the busbar 125 and is in contact with the nickel plated layer 125b of the busbar 125. As described above, in the electric contact portion 159 to be welded in a state of being in contact with the nickel plated layer 125b at two places, the top T and the tip E, a part of the tin plated layer 121b is not sufficiently melted at each of the top T and the tip E and remains in the terminal base material 121a.

The reason why a part of the tin plated layer 121b does not melt sufficiently at each of the top T and the tip E is as follows. In other words, the electrical contact portion 159 is in contact with the busbar 125 at two places, and thus the thermal energy applied by welding is dispersed in two places. For example, when electric welding is adopted as a welding method, current is divided and flows in two places. Therefore, the amount of heat generated at each of the two places is smaller than that in a case where the electric contact portion 159 and the busbar 125 are in contact with each other at only one place. As a result, a part of the tin plated layer 121b does not melt sufficiently and remains in the terminal base material 121a.

In other case, in the voltage detection terminal 121 having a relatively small thickness, the protrusion 121c may be crushed due to the pressing force during welding. In such a situation, a portion where the protrusion 121c is provided is brought into contact with the busbar 125 at many places, and thus the thermal energy applied by welding will be also dispersed.

Though it is an unnecessary addition, in a case (that is, a case where the layer denoted by 125b in the comparative example is a tin plated layer) where the voltage detection terminal 121 is plated with tin and the busbar 125 is also plated with tin, the inventor finds that the tin plated layer 121b scatters around as spatters at each of the top T and the tip E and is removed from the terminal base material 121a even when the electric contact portion 159 and the busbar 125 are in contact with each other at two places as illustrated in FIG. 6B. This is because tin has a melting point lower than that of nickel, even with each dispersed thermal energy, it has the energy amount enough to melt tin.

On the other hand, in the case of the comparative example, each dispersed thermal energy is deprived by nickel having a melting point higher than that of tin, and the thermal energy supplied to tin does not reach the extent that tin can be sufficiently melted. As described above, the inventor has ascertained that, in the comparative example, the phenomenon where a part of the tin plated layer 121b does not sufficiently melt and remains in the terminal base material 121a is caused by contact between the electric contact portion 159 and the busbar 125 at two places and adoption of nickel having a melting point higher than that of tin as the plating layer of the busbar 125. The inventor of the invention has extensively studied the structure capable of sufficiently melting the tin plated layer of the voltage detection terminal while nickel which is more resistant to corrosion by electrolyte than tin is adopted as a plating layer of the busbar, and as a result, the inventor arrives at the welded structure of the invention.

In other words, in the conductor module mounting structure according to the embodiment of the invention, a protrusion is not formed in the voltage detection terminal 21 and the protrusion 25c is formed in the busbar 25. Therefore, as shown in FIG. 5B, even when the electric contact portion 59 of the voltage detection terminal 21 is pressed and inclined so that the tip of the electric contact portion 59 is directed downward at the time of welding, the voltage detection terminal 21 and the busbar 25 are in contact with each other at one place. Further, as compared with a case where the protrusion 25c is formed in the voltage detection terminal 21, it is possible to prevent the protrusion 25c from being crushed due to the pressing at the time of welding by forming the protrusion 25c in the busbar 25 of which the thickness is greater than that of the voltage detection terminal 21. Thus, it is easy to set the number of contact places between the voltage detection terminal 21 and the busbar 25 to be one at the time of welding. Therefore, the thermal energy applied by welding is concentrated in one place. As a result, even when nickel is adopted in the plating layer of the busbar 25 and the thermal energy is easily lost by nickel, the tin plated layer 21b formed on the voltage detection terminal 21 can be sufficiently melted.

As described above, according to the conductor module mounting structure of the embodiment of the invention, a part of the tin plated layer 21b which is in contact with the top T of the protrusion 25c can be melted effectively. As a result, a part of the tin plated layer 21b is scattered around as spatters and removed from the terminal base material 21a, and thus the connection between the voltage detection terminal and the busbar is not hindered by tin plating which is not sufficiently melted and remains. Therefore, a favorable connection between the voltage detection terminal and the busbar can be secured.

Further, in the conductor module mounting structure according to the embodiment of the invention, the protrusion 25c protruding toward the voltage detection terminal 21 is formed in the busbar 25, and thus a gap S is formed between the protrusion 25c of the busbar 25 and the partition wall 39 or the rib 37a of the unit cell accommodating chamber 37. Therefore, even when the protrusion 25c becomes high temperature during welding, a heat insulating effect is obtained by the air present in the gap S, and thus it is possible to prevent a part (the unit cell accommodating chamber 37) of the case 13 from being melted due to heat generation of the protrusion 25c. This is extremely useful in a structure where the voltage detection terminal 21 and the busbar 25 are welded after the protector 17 is accommodated in the case 13 as in the embodiment of the invention.

Although a form where the welded structure according to the invention is applied to the conductor module is described in detail, this is merely one form of the welded structure according to the invention. The welded structure according to the invention is not limited to those applied to the conductor module but can be applied to various welded structures in which two conductors are welded.

In a conductor module mounting structure according to the embodiment of the invention, the metal material plated on one (the voltage detection terminal 21) of the two conductors is tin and the metal material plated on the other (the busbar 25) is nickel. However, the metal material to be plated on the other is not limited to nickel. As long as the metal material has a melting point higher than that of tin, it can be adopted as the material subjected to plating treatment for the other metal material. For example, gold, silver and the like can be adopted as a metal material to be plated on the other.

Here, the features of the embodiment of the welded structure according to the invention described above are summarized briefly in the following [1] to [3], respectively.

[1] A welded structure, including:
a first conductor (voltage detection terminal 21) which is plated with one of tin and a metal material having a melting point higher than that of the tin; and
a second conductor (busbar 25) which is plated with the other of the tin and the metal material, has a thickness greater than that of the first conductor (voltage detection terminal 21), and is formed with a protrusion (25c) which protrudes toward the first conductor (voltage detection terminal 21) on a part of a surface facing the first conductor (voltage detection terminal 21) at a time of being welded with the first conductor (voltage detection terminal 21), wherein
a part of the first conductor (voltage detection terminal 21) located at a position opposite to the protrusion (25c) and a top (T) of the protrusion (25c) of the second conductor (busbar 25) are joined so that the first conductor (21) and the second conductor (25) are welded to each other.

[2] The welded structure according to [1], wherein
the metal material is nickel.

[3] The welded structure according to [2], wherein
the second conductor is a busbar (25) which is connected to an electrode (a positive electrode 33, a negative electrode 35) formed in a battery pack (11), and
the first conductor is a voltage detection terminal (21) which is connected to the busbar (25) for detecting a voltage of the electrode (the positive electrode 33, the negative electrode 35).

According to the welded structure having the configurations described above, a part of the tin plated layer of the first conductor (a voltage detection terminal) which is brought into contact with the top of the protrusion can be effectively melted. As a result, the part of the tin plated layer is scattered around as spatters and disappeared from the terminal base material, and thus connection between the first conductor (the voltage detection terminal) and the second conductor (a busbar) is not hindered by tin plating which is not sufficiently melted. Therefore, favorable connection between the voltage detection terminal and the busbar can be secured.

According to the welded structure of the invention, it is possible to realize favorable connection between a conductor plated with tin and another conductor plated with a metal material having a melting point higher than that of tin.

What is claimed is:

1. A welded structure, comprising:
a first conductor which is plated with one of tin and a metal material having a melting point higher than that of the tin; and
a second conductor which is plated with the other of the tin and the metal material, has a thickness greater than that of the first conductor, and is formed with a protrusion which protrudes toward the first conductor on a part of a surface facing the first conductor at a time of being welded with the first conductor, wherein
a part of the first conductor located at a position opposite to the protrusion and a top of the protrusion of the second conductor are joined so that the first conductor and the second conductor are welded to each other by only a single weld.

2. The welded structure according to claim 1, wherein the metal material is nickel.

3. The welded structure according to claim 2, wherein the second conductor is a busbar which is connected to an electrode formed in a battery pack, and
the first conductor is a voltage detection terminal which is connected to the busbar for detecting a voltage of the electrode.

4. The welded structure according to claim 1, wherein the first conductor includes a terminal body portion, an electrical contact portion, a conductor connection portion, and a voltage detection conductor,
the electrical contact portion protrudes from the terminal body portion and is welded to the protrusion by only the single weld,
the conductor connection portion is crimped onto the voltage detection conductor, and is spaced away from the electrical contact portion by the terminal body portion.

5. The welded structure according to claim 1, wherein the first conductor has an electric contact portion with a tip end, and
the tip end of the electric contact portion is inclined toward the second conductor at the time of being welded.

* * * * *